US012562631B2

(12) United States Patent
Tourret

(10) Patent No.: US 12,562,631 B2
(45) Date of Patent: Feb. 24, 2026

(54) GATE DRIVER FOR A LOW DROPOUT VOLTAGE REGULATOR

(71) Applicant: NXP B.V., Eindhoven (NL)

(72) Inventor: Jean-Robert Tourret, Cormelles le Royal (FR)

(73) Assignee: NXP B.V., Eindhoven (NL)

( * ) Notice: Subject to any disclaimer, the term of this patent is extended or adjusted under 35 U.S.C. 154(b) by 208 days.

(21) Appl. No.: 18/467,030

(22) Filed: Sep. 14, 2023

(65) Prior Publication Data

US 2024/0113612 A1 Apr. 4, 2024

(30) Foreign Application Priority Data

Sep. 30, 2022 (EP) .................................... 22306461

(51) Int. Cl.
| | |
|---|---|
| *H02M 1/00* | (2006.01) |
| *G05F 1/56* | (2006.01) |
| *G05F 1/575* | (2006.01) |
| *H02M 1/08* | (2006.01) |
| *H02M 3/07* | (2006.01) |
| *H03H 21/00* | (2006.01) |

(52) U.S. Cl.
CPC ........... *H02M 1/0045* (2021.05); *G05F 1/56* (2013.01); *G05F 1/575* (2013.01); *H02M 1/08* (2013.01); *H02M 3/07* (2013.01); *H03H 21/0021* (2013.01); *G05F 1/561* (2013.01)

(58) Field of Classification Search
CPC ............ H03H 21/0021; H02M 1/0045; H02M 1/08; H02M 3/07; G05F 1/56; G05F 1/575; G05F 1/561
See application file for complete search history.

(56) References Cited

U.S. PATENT DOCUMENTS

| | | | | | |
|---|---|---|---|---|---|
| 3,369,189 | A | * | 2/1968 | Hoffman | H03H 11/1295 |
| | | | | | 330/109 |
| 4,704,726 | A | * | 11/1987 | Gibson | H04N 5/607 |
| | | | | | 381/13 |
| 6,469,569 | B1 | * | 10/2002 | Miyamitsu | H02M 3/073 |
| | | | | | 327/536 |
| 6,487,133 | B2 | | 11/2002 | Wada et al. | |

(Continued)

OTHER PUBLICATIONS

Lee C-H et al: "A Supply-Noise-Insensitive CMOS PLL With a Voltage Regulator Using DC-DC Capacitive Converter", IEEE Journal of Solid-State Circuits, IEEE, USA, vol. 36, No. 10, Oct. 1, 2001 (Oct. 1, 2001), pp. 1453-1463, XP001168144 ISSN: 0018-9200, DOI: 10.1109/4.896235.

*Primary Examiner* — Gary L Laxton

(57) ABSTRACT

A low drop-out (LDO) regulator includes an NMOS transistor having one of a source and drain terminal configured to be coupled to a voltage supply and the other of the source and drain terminal coupled to the low drop out voltage regulator output. A gate driver for the LDO regulator includes a boost converter having a boost converter input configured to be coupled to a boost converter reference voltage, a boost converter output configured to output a boosted voltage greater than the boost converter reference voltage and the voltage supply; and a boost converter clock input configured to receive a clock signal. The gate driver further includes a notch filter having a notch filter input coupled to the boost converter output and a notch filter output coupled to the gate driver output.

20 Claims, 6 Drawing Sheets

200

(56) References Cited

U.S. PATENT DOCUMENTS

| | | | |
|---|---|---|---|
| 7,148,666 B1 | 12/2006 | Tai et al. | |
| 8,198,877 B2 | 6/2012 | Kuan et al. | |
| 9,048,849 B2 * | 6/2015 | Choi ..................... | H03L 7/093 |
| 9,778,672 B1 | 10/2017 | Gao et al. | |
| 10,312,921 B1 * | 6/2019 | Cheng .................... | H03L 7/099 |
| 12,074,514 B2 * | 8/2024 | Radhakrishnan ....... | H02M 3/07 |
| 2003/0111986 A1 | 6/2003 | Xi | |
| 2011/0089916 A1 * | 4/2011 | Soenen .................. | G05F 1/575 |
| | | | 323/280 |
| 2014/0312867 A1 | 10/2014 | Pulvrenti et al. | |

* cited by examiner

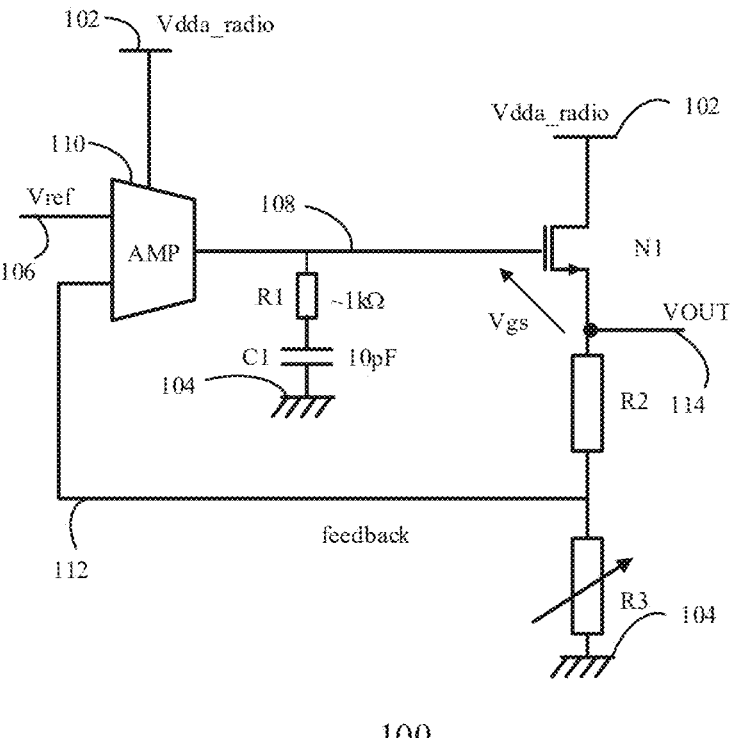
100
FIG. 1 --Prior Art--
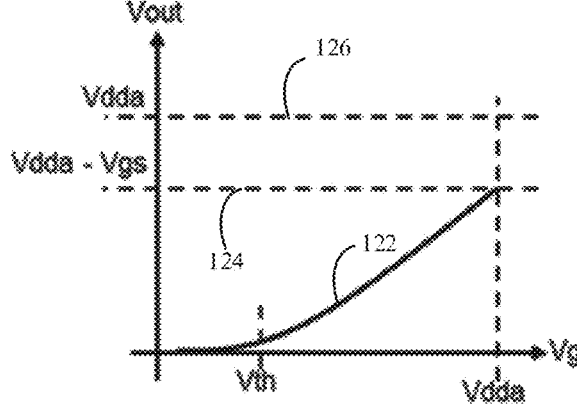
120
FIG. 2 --Prior Art--

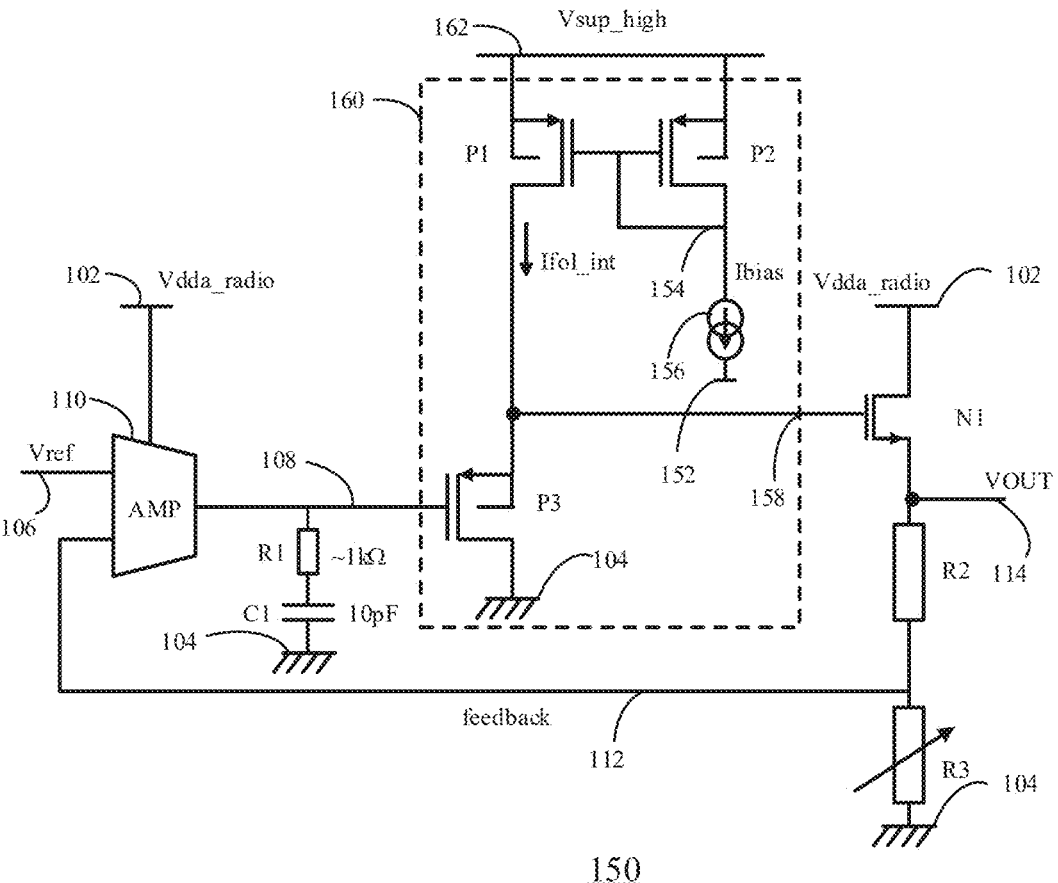
FIG. 3 --Prior Art--

200

Notch @ Fxo          Notch @ 2Fxo          Notch @ 4Fxo          Notch @ 4Fxo

300

350

400

500

600

GATE DRIVER FOR A LOW DROPOUT VOLTAGE REGULATOR

FIELD

This disclosure relates to a gate driver for a low dropout voltage regulator.

BACKGROUND

Voltage regulators such as Low Drop Output (LDO) voltage regulators are used extensively within Integrated Circuits (ICs) to supply independent voltage domains on the IC. These regulators may be referred to as cap-less regulators when no additional capacitor external to the IC is used. Each independent voltage domain may have their own requirements in terms of for example Power Supply Rejection Ratio (PSRR), current consumption, start-up time, load current capability.

Two common implementations for LDO regulators have a PMOS transistor output stage which may be referred to as a P-type output stage or NMOS transistor output stage which may be referred to as a N-type output stage.

P-type output stage LDO regulators generally have a very good PSRR within their loop bandwidth, i.e. up to a few MHz. The PSRR is also good for very high input noise frequencies, due to the presence of an output capacitor. However, the PSRR in the mid-range frequencies (few MHz up to hundreds of MHz) is generally poor.

When the output capacitor is an external capacitor, i.e. not a capless regulator, P-type output stage LDO regulators show a much improved PSRR in the mid-range frequencies, because the main pole is generally on the output stage, due to the large capacitor value. However, stability compensation always remains difficult because the main pole typically has to be decades lower than the other poles. If no pole tracking arrangement is implemented in the regulator, then the secondary poles may be close to the main pole for large load currents. A P-type LDO with external decoupling and a large capacitance value capacitor can support a very large range of load currents. However, an external capacitor still requires a specific pad for decoupling.

For N-type output stage LDO regulators, the main pole is generally not on the output stage, because of the low impedance formed by the 1/gm of the power stage, which is also referred to as a voltage follower. The consequence is that the main pole is within the regulator itself, and to some extent less dependent on the load current. The stability is then easier to manage.

In addition, compared to P-type regulators, N-type regulators may have a faster reaction time, and minimum output impedance out of the loop bandwidth due to the 1/gm of the voltage follower power stage, which also provides a natural pole tracking with the load.

Whenever possible, when no extra-pad can be used for decoupling, it is may be preferable to use N-type regulators rather than P-type regulators when no extra-pad can be used for decoupling.

SUMMARY

Various aspects of the disclosure are defined in the accompanying claims. In a first aspect there is provided a gate driver for a low drop-out (LDO) regulator, the LDO regulator including an NMOS transistor having one of a source and drain terminal configured to be coupled to a voltage supply and the other of the source and drain terminal coupled to the low drop out voltage regulator output, the gate driver comprising: a boost converter comprising: a boost converter input configured to be coupled to a boost converter reference voltage; a boost converter output configured to output a boosted voltage greater than the boost converter reference voltage and the voltage supply; a boost converter clock input configured to receive a clock signal; the gate driver further comprising: a notch filter having a notch filter input coupled to the boost converter output and a notch filter output coupled to the gate driver output.

In one or more embodiments, the notch filter may comprise notches at frequencies of integer multiples of the clock signal frequency.

In one or more embodiments, the notch filter notches may comprise frequencies of the clock signal frequency, twice the clock signal frequency and four times the clock signal frequency.

In one or more embodiments, the notch filter may comprises a T-notch circuit.

In one or more embodiments, the notch filter may comprise a further output, and the gate driver may further comprise a feedback amplifier having a first feedback amplifier input coupled to the further notch filter output, a second feedback amplifier input configured to be coupled to a feedback reference voltage, and a feedback amplifier output coupled to a voltage supply rail of the clock generator, wherein the clock generator is configured to modulate the clock amplitude dependent on the difference between the further notch filter output voltage and the feedback reference voltage.

In one or more embodiments, the gate driver may further comprise a local LDO regulator having a local LDO regulator output, wherein the local LDO regulator output is coupled to a voltage supply rail of the clock generator and a boost converter input.

In one or more embodiments, the boost converter may further comprise a charge pump.

In one or more embodiments, the boost converter may further comprise a series arrangement of three charge pumps.

In one or more embodiments, the gate driver may further comprise a clock generator having a clock generator output coupled to the boost converter clock input and configured to output the clock signal on the clock generator output.

One or more embodiments of the gate driver may be included in a power management system which may further comprise a low-drop out (LDO) regulator, the LDO regulator comprising: an NMOS transistor having one of a source and drain terminal configured to be coupled to a voltage supply and the other of the source and drain terminal coupled to a LDO regulator output; and a bias control circuit having a bias control circuit input coupled to the notch filter output; and a bias control circuit output coupled to the NMOS transistor gate.

In one or more embodiments, the power management circuit may further comprise a feedback capacitor coupled between the bias control circuit output and the ground.

In one or more embodiments, the LDO regulator may further comprise a LDO feedback amplifier and a series arrangement of a first resistor and a first capacitor coupled between the LDO feedback amplifier output and a ground and coupled to a second bias control circuit input.

In one or more embodiments, the LDO regulator may further comprise a second and third resistor arranged in series between the LDO output and the ground, and the LDO feedback amplifier further comprises a LDO feedback amplifier supply node coupled to the LDO output, a first LDO feedback amplifier input coupled to a common node between the second and third resistor, a second LDO feedback amplifier input coupled to a bias reference voltage.

In one or more embodiments, the LDO regulator may further comprise further comprises a second and third resistor arranged in series between the LDO output and the ground, and the LDO feedback amplifier further comprises a LDO feedback amplifier supply node configured to be coupled to the voltage supply, a first LDO feedback amplifier input coupled to a common node between the second and third resistor, a second LDO feedback amplifier input coupled to a bias reference voltage.

In one or more embodiments, the power management circuit may further comprise at least one further LDO regulator coupled to the gate driver, wherein the at least one further regulator is configured to be coupled to a voltage supply in a different voltage domain than the LDO regulator.

In a second aspect, there is described method of driving a gate of an output stage NMOS transistor included in a LDO regulator having one of a source and drain terminal configured to be coupled to a voltage supply and the other of the source and drain terminal coupled to the low drop out regulator output, the method comprising: boosting a boost converter reference voltage; notch filtering the boosted reference voltage; and providing the filtered boosted reference voltage to the LDO regulator to drive the gate of the NMOS transistor; wherein the filtered boosted reference voltage is greater than the voltage of the voltage supply.

In one or more embodiments, the method may further comprise notch filtering the boosted reference voltage with a notch filter comprising notches at frequencies of integer multiples of the clock signal frequency.

In one or more embodiments, notches of the notch filter may comprise frequencies of the clock signal frequency, twice the clock signal frequency and four times the clock signal frequency.

In one or more embodiments, the method may be included in a method of power management which may further comprise: providing a low-drop out, LDO, regulator, the LDO regulator comprising: an NMOS transistor having one of a source and drain terminal configured to be coupled to a voltage supply and the other of the source and drain terminal coupled to a LDO regulator output; and a bias control circuit having a bias control circuit input coupled to the notch filter output; and a bias control circuit output coupled to the NMOS transistor gate.

BRIEF DESCRIPTION OF THE DRAWINGS

In the figures and description like reference numerals refer to like features. Embodiments are now described in detail, by way of example only, illustrated by the accompanying drawings in which:

FIG. 1 shows a typical LDO regulator with an NMOS output stage circuit illustrating the gate-drive limitations.

FIG. 2 illustrates the variation of output voltage with respect to the gate voltage in the circuit of FIG. 1

FIG. 3 shows a typical LDO regulator with an NMOS output stage circuit illustrating the use of a higher voltage domain to control the gate-drive.

Figure 4:
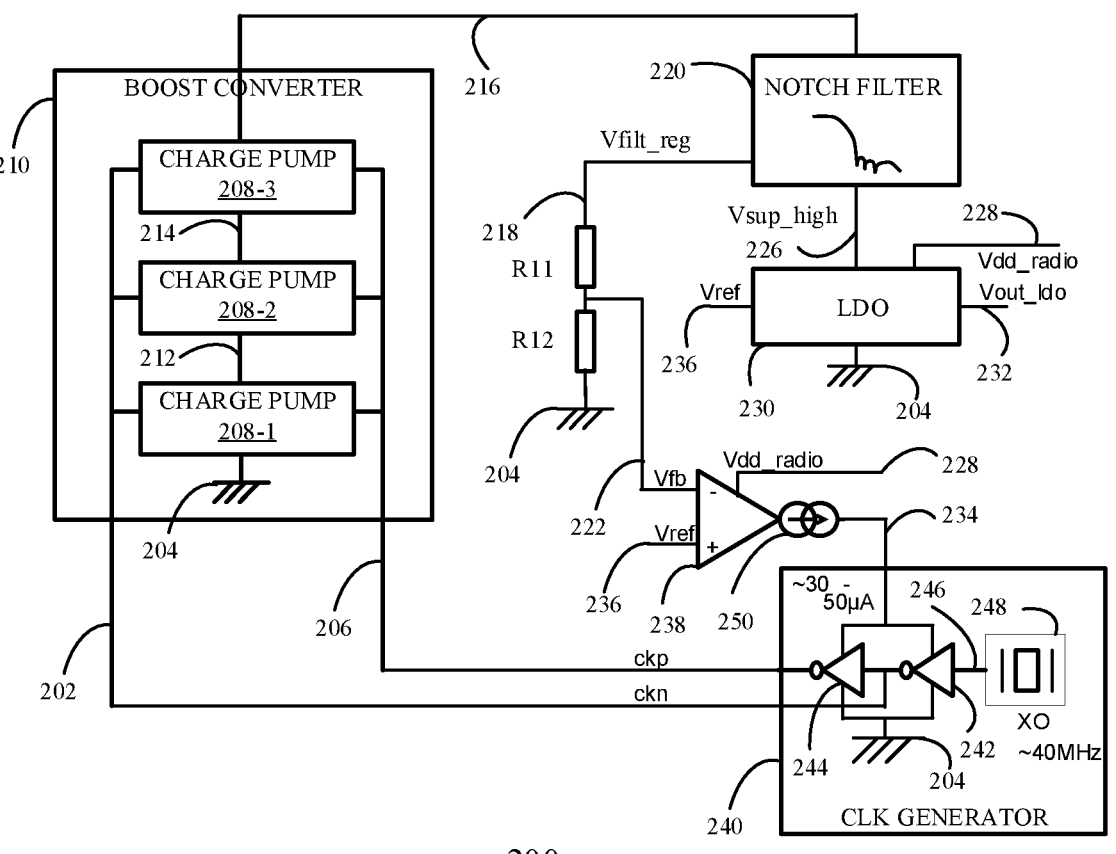
FIG. 4 shows a LDO regulator including a gate driver according to an embodiment.

It should be noted that the figures are diagrammatic and not drawn to scale. The relative dimensions and proportions of parts of these figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

FIG. 1 Shows a typical a LDO regulator 100 including an NMOS output stage circuit illustrating the gate-drive limitations. An NMOS transistor N1 has a drain connected to a supply rail 102 and a source connected to an output 114. A series arrangement of a resistor R2 and resistor R3 is connected between the output 114 and a ground 104. Circuit node 112 is connected to the common connection between the resistances R2 and R3 and an input of a LDO feedback amplifier 110. A second input 106 of the LDO feedback amplifier 110 may be connected to a bias reference voltage supply. The LDO feedback amplifier 110 may be connected to the voltage supply rail 102. The amplifier output 108 is connected to the gate of the NMOS transistor N1. A resistor R1 and capacitor C1 are connected in series between the amplifier output 108 and ground 104. The NMOS transistor N1 is configured as a voltage follower.

FIG. 2 shows a graph 120 which illustrates the variation of output voltage with respect to the gate voltage in the LDO regulator 100. The x-axis shows the variation in gate voltage Vg of the NMOS transistor N1 and the y-axis shows the variation in the output voltage Vout at the output 114. The reference to the line 122, as can be seen Vout is at first order Vg—Vgs where Vgs is the gate-source voltage difference. Dashed lines 124 shows the maximum output voltage and dashed line 126 shows the voltage Vdda of supply voltage rail 102. The gate-source voltage Vgs depends on the load current and further reduces the maximum reachable output voltage when the load current becomes large and is always limited at least to Vdda—Vth for small load currents, where Vdda is the supply voltage provided to the voltage supply rail 102 and Vth is the threshold voltage of the NMOS transistor N1. Some process nodes may offer specific components like native MOS transistors which may have a threshold voltage Vth close to or even below 0V. For these examples, N-type regulators are almost always used and Vout can be regulated to targets close to Vdda. However, these N-type regulators may require a specific arrangement to actually turn off the regulator, because grounding the gate does not guarantee that the transistor N1 is shut down.

FIG. 3 shows a typical LDO regulator 150 illustrating the use of a higher voltage domain to control the gate-drive. The LDO regulator 150 is similar to the LDO regulator 100 but includes a bias control circuit 160 having a bias control input connected to the amplifier output 108 and a bias control output 158 connected to the gate of the NMOS transistor N1. The bias control circuit 160 includes first and second PMOS transistors P1, P2 in a current mirror configuration. The sources of P1 and P2 are connected to a second supply voltage rail 162 which has a higher supply voltage denoted Vsup_high than the supply rail 102. Circuit node 154 connects the gates of P1 and P2 to the drain of P2. A current source 156 is connected in series between circuit node 154 and a reference 152 which may be a ground or other voltage reference. The drain of PMOS transistor P1 is connected to the bias control output 158. A third PMOS transistor P3 acts a voltage follower and has a source connected to the bias control output 158 and a drain connected to the ground 104. In operation P1 acts as a P-type current source which provides current Ifol_int to bias the voltage follower transistor P3. The voltage follower transistor P3 may shift up the voltage at amplifier output 108 by the gate source voltage VGS. By doing so, the maximum voltage Vbias at the bias control output 158 is close to Vdda_radio+VSG_P3. Because the voltage transfer function of the NMOS pass device N1 is VOUT=V158−VGS_N1, the maximum possible output voltage of the LDO regulator 150 is then Vdda_radio+VSG_P3−VGS_N1 which is approximately equal to Vdda_radio, with VGS being dependent for example on the device type and biasing current. In practice, PMOS transistor P3 and the current Ifol_int will be chosen such that VSG_P3>VGS_N1, to avoid the voltage at amplifier output 108 being too close to Vdda_radio.

For P1 to operate properly, Vsup_high should be >Vbias+VSDsat_P1. Another benefit of the bias control circuit 160 is that it isolates NMOS pass device N1 from the voltage at the amplifier output 108 by the known technique of pole-shifting.

A higher voltage domain may be used to control the gate to overcome the limitation of LDO regulator 100. However, a higher voltage domain may not always be available, and may bring in undesired noise due to a possible noisy supply. In some other arrangements, tightly linked to specific process nodes like FDSOI, or SOI, the bulk of the pass device may be biased such that the threshold Vth reduces, reducing the voltage headroom required. However, not all technologies may provide this option.

FIG. 4 shows a power management system 200 according to an embodiment. The power management system includes a boost converter 210, a notch filter 220, a LDO regulator 230, and a clock generator 240. As illustrated, the boost converter 210 includes a series arrangement of three charge pumps 208-1, 208-2, 208-3. In other examples, the boost converter may include fewer or more charge pumps. The first charge pump 208-1 may have an input connected to ground 204. The first charge pump output 212 may be connected to an input of the second charge pump 208-2. The second charge pump output 214 may be connected to an input of the third charge pump 208-3. The output of the third charge pump 208-3 may be connected to the boost converter output 216. A first clock input of the boost converter 210 may be connected to an inverse clock output 202 from the clock generator 240. A second clock input of the boost converter 210 may be connected to a clock output 206 from the clock generator 240.

The boost converter output 216 may be connected to an input of the notch filter 220. A first output of the notch filter 220 may be connected to the high-voltage supply node 226.

The LDO 230 may have a first terminal connected to the high-voltage supply node 226, a second terminal connected to a voltage reference 236, a third terminal connected to ground 204 and a fourth terminal connected to voltage supply 228 which in operation has a lower voltage than the high-voltage supply node 226. LDO output 232 may supply a regulated output voltage Vout_ldo. The LDO 230 may be implemented for example by LDO regulator 150.

A second or further output of the notch filter 220 may be connected to second notch filter output 218. Resistors R11, R12 may be connected between second notch filter output 218 and ground 204. The common connection between resistors R11 and R12 may be connected to an inverting input 222 of a feedback amplifier 238 which may also be referred to as a feedback amplifier. A non-inverting input of the feedback amplifier 238 may be connected to a feedback voltage reference 236. The feedback amplifier 238 may be connected to voltage supply 228. The operational amplifier output may be connected to current source 250.

The clock generator 240 may generate a clock signal clkp and inverse clock signal clkn. The clock generator 240 may have first and second clock inverters 242, 244 which are connected in series and connected to a supply node 234 and ground 204. The current source 250 output may be connected to the voltage supply rail 234 of clock inverters 242, 244. The input of the first clock inverter 244 may be connected to the output 246 of a crystal oscillator 248. The output of the first clock inverter 242 may be connected to the inverse clock signal output 202. The output of the second clock inverter 244 may be connected to the clock signal output 206.

The operation of power management system 200 is now described with reference to example supply voltages, currents, component values and clock frequencies. It will be appreciated that other supply voltages and component values may be used depending on the specific implementation. In one example the main supply voltage vdda on supply 228 may be 0.7 volts. In operation, the boost converter 210 performs a multiplication by 3 of the clock amplitude of clkp, clkn. Based on a supply of 0.7 volts, the boost converter generates a ~2V output which is rich in harmonics content. This boosted output is then filtered by notch filter 220 which provides an output on first boost converter output 216 which may for example be a voltage of 1.5 volts. This boosted voltage Vsup_high is supplied to the LDO 230. Similarly to LDO regulator 150, this higher voltage is used to control the gate of the NMOS output transistor within the LDO 230. An optional second notch filter output 218 provides a second boosted voltage Vfilt_reg which may be slightly higher than the Vsup_high for example 1.6 volts due to voltage drop within the T-notch filter 220 caused by the LDO gate control branch current bias.

This voltage Vfilt_reg is divided by resistors R11, R12 to provide a feedback voltage Vfb to the inverting input 222. The amplifier output increases or decreases depending on the difference between the value of the feedback voltage Vfb and the value of the feedback reference voltage, which in turn via current source 250 which may provide a current of 30-50 μA. The amplifier output modulates (increases and/or decreases) the amplitude of the clocks clkp, clkn until the voltage Vsup_high settles at the desired level, for example 1.5 volts.

Figure 5:
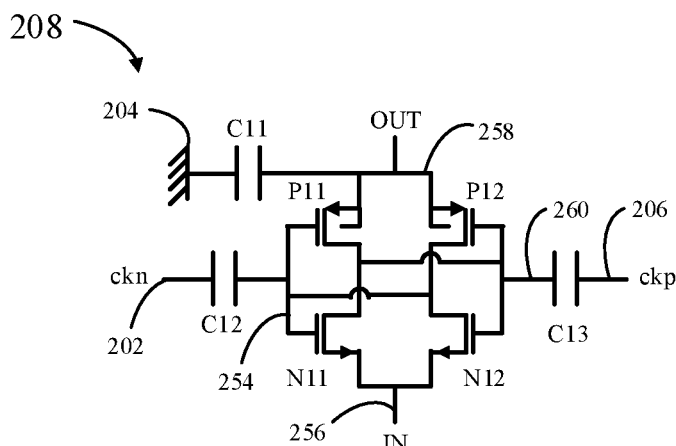
FIG. 5 shows an example charge pump circuit implementation for the LDO regulator of FIG. 4.

FIG. 5 shows an implementation detail for charge pump 208. A charge pump input 256 is connected to the sources of NMOS transistors N11, N12. Node 254 is connected to the gates of PMOS transistor P11 and NMOS transistor N11 and the drains of PMOS transistor P12 and NMOS transistor N12. Node 260 is connected to the gates of PMOS transistor P12 and NMOS transistor N12 and the drains of PMOS transistor P11 and NMOS transistor N11. The sources of PMOS transistors P11 and P12 are connected to the charge pump output 258. Capacitor C11 is connected between the charge pump output 258 and ground 204. Capacitor C12 is connected between the inverted clock input 202 and node 254. Capacitor C12 is connected between the clock input 206 and node 260. Capacitors C11, C12,C13 may have a capacitance of 1 pF for first and second charge pumps 208-1,208-2. Capacitors C12, C13 may have a capacitance of 1 pF and capacitor C11 may have a value of 3 pF for charge pump 208-3. The value of the capacitors used in the charge pump is chosen with regards to the available area and the load current to deliver. The larger the load current, the larger the capacitors. In the implementation example, 1 pF and 3 pF are enough, but depending on the current drained from the notch filter 220, those capacitors may be sized differently The charge pump 208 consists of a two-step charge transfer system. PMOS transistor P12 (or P11) is optional, as the charge pump circuit 208 may operate with only N11, N12 and one of the two PMOS. Considering a circuit with only P11 for example, the PMOS device P11 acts as a switch. Suppose the amplitude of the clock is equal to the DC value of IN. In a steady-state, OUT=IN+amplitude of the clock=2*IN. In a first phase, where the clock ckn is HIGH or logic 1 and the clock ckn is LOW or logic 0, P11 is open and maintains OUT=2*IN. V254=OUT, V260=IN. In a second phase (ckn=logic '0' and ckp=logic '1'), P11 is closed and C12 delivers its charges to C11. The voltage at node 254=IN and the voltage at node 260=OUT. The regular clock alternance makes the system converge to OUT=2*IN due to the charge transfer.

Adding a second PMOS transistor P12 enables the charge transfer to occur twice in a clock period, as P12 works in opposite phase with P11. Hence C11 is charged during half period by capacitor C12, and by capacitor C13 during the other half period.

Figure 6:
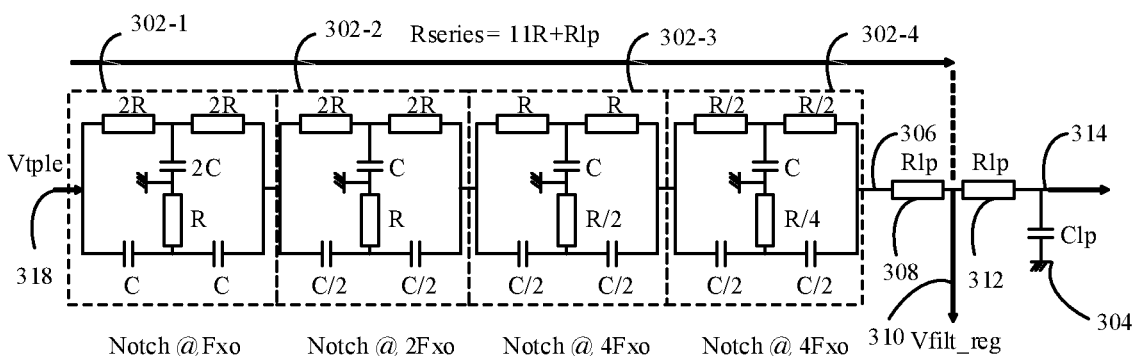
FIG. 6 shows an example notch filter implementation for the LDO regulator of FIG. 4.

FIG. 6 shows an example implementation of a notch filter 300 which may for example be used to implement notch filter 220. Notch filter 300 includes a series arrangement of four T-notch stages 302-1, 302-2, 302-3, 302-4. The input of the first T-notch stage 302-1 may be connected to the notch filter input 318. The final T-notch stage output 306 may be connected to a series arrangement of two resistors 308, 312 between the final T-notch stage output 306 and the first notch filter output 314. The common connection between resistors 308,312 may be connected to the second notch filter output 310. A capacitor C1*p* may be connected between the first notch filter output 314 and ground 304. As illustrated the notch filter first T-notch stage 302-1 may have a notch at the crystal oscillator frequency Fxo, the notch filter second T-notch stage 302-2 may have a notch at twice the crystal oscillator frequency 2Fxo, the notch filter third T-notch stage 302-3 may have a notch at four times the crystal oscillator frequency 4Fxo, and the notch filter fourth T-notch stage 302-4 may have a notch at four times the crystal oscillator frequency 4Fxo. In general, the notches may depend on the clock's harmonic content and on the available clock source. In other examples different notch values may be used.

The notch filter 300 may combine the benefits of a low pass filter, which cuts-out any frequency content past the cut-off frequency, and notches, which deeply suppress the noise for a given frequency. T-notches 302 enable a large suppression of tones when those tones are well known, which is the case with a known fixed clock frequency. Adding T-notches in series may build up a flat response over a large frequency range. In other examples different arrangements of resistors and capacitors may be used, to balance between voltage drop and capacitor area.

Figure 7:
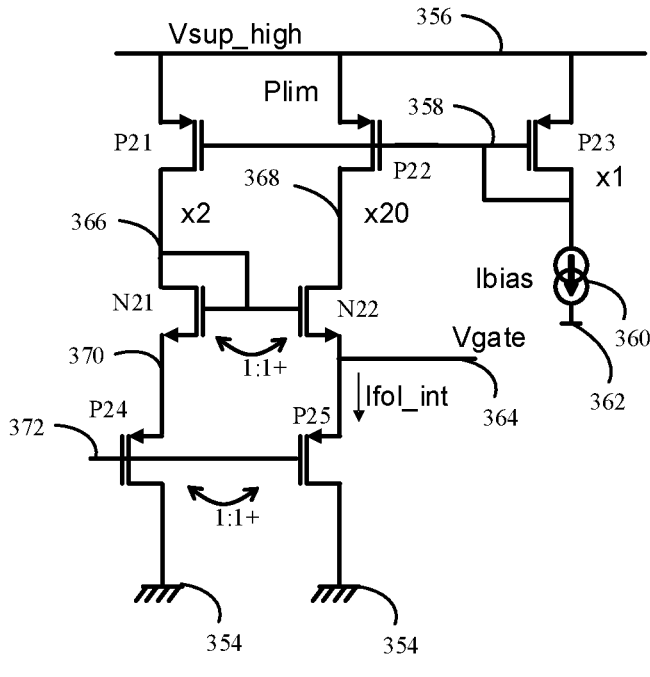
FIG. 7 shows an example bias control circuit for the LDO regulator of FIG. 4.

FIG. 7 shows a bias control circuit 350 having a class AB topology that may be used for example instead of bias control circuit 160 in the LDO regulator 150. High voltage supply 356 may be connected to a source of PMOS transistors P21,P22,P23. The gates of PMOS transistors P21, P22,P23 and the source of PMOS transistor P23 are connected to node 358. A current source 360 may be connected between node 358 and a voltage reference 362 which may be ground. Node 366 is connected to the gates of NMOS transistors N21, N22. Node 368 is connected to the source of PMOS transistor P22 and the source of NMOS transistor N22. Node 370 is connected to the sources of NMOS transistor N21 and PMOS transistor P24. The bias control output 364 is connected to the sources of NMOS transistor N22 and PMOS transistor P25. The drains of PMOS transistors P24, P25 are connected to ground 354. The gates of PMOS transistors P24, P25 are connected to the bias control circuit input 372. PMOS transistor P21 may be dimensioned to have a width to length channel ratio which is twice the ratio of P23. P22 may be dimensioned to have a width to length channel ratio which 20 times the ratio of P23.

The bias control output 364 provides a voltage denoted Vgate which is biased in class AB. In operation, PMOS transistor P21, provides a x2 copy of the reference current Ibias which flows in the N21 diode connected transistor and biases the PMOS transistor P24 which is configured as a voltage follower. Thus, the branch formed by transistors P24, N21, P21 works under a fixed current of 2*Ibias. The branch formed by transistors P25, N22, P22 does not operated under a fixed current. For example suppose P22 is shorted so that the voltage at node 368=Vsup_high. Transistors P25 and N22 form a class-AB push-pull, acting as a voltage follower. If transistors P25, N22 are approximately the same size as transistors P24, N21, then if no current is needed from Vgate which is the case in DC. As this node 368 only drives a gate, the current flowing through transistors P25, N22 will be the same as the one flowing in the branch with transistors P24, N21, resulting in a current of 2*Ibias.

If for some reason some current is needed i.e. Vgate suddenly increasing or decreasing, then N22 or P25 will deliver the current, as they are voltage followers, so N22 can deliver current if Vgate falls, P25 can deliver current if Vgate increases.

The function of optional PMOS transistor is to act as a current limiter in case Vgate gets shorted so that the load demands on the voltage supply Vsup_high are not too large. In a normal use, the current needed on Vgate will be around 0 in steady-state, thus the voltage at node 368 will remain Vsup_high. In operation when the LDO regulated voltage Vout drops, NMOS transistor N22 provides the AC current to the gate, limited by PMOS transistor P22. When Vout bounces high, transistor P25 drives the opposite AC current to the gate.

As explained above, the whole structure requires a current of 5*Ibias, for a current capability only limited by transistor P22. The devices may need a good match to avoid either class A or class C operation. It is preferable to be closer to a class A operation in which case N22 and P25 may be sized a bit larger than N21 and P24. The addition of N22 in series with P25 may require Vsup_high to be for example at least 1.7V for a regulated output of approximately 0.9 volts. It will be appreciated that in other examples the current ratios may be different, depending on the current consumption targets, or circuit speed.

Figure 8:
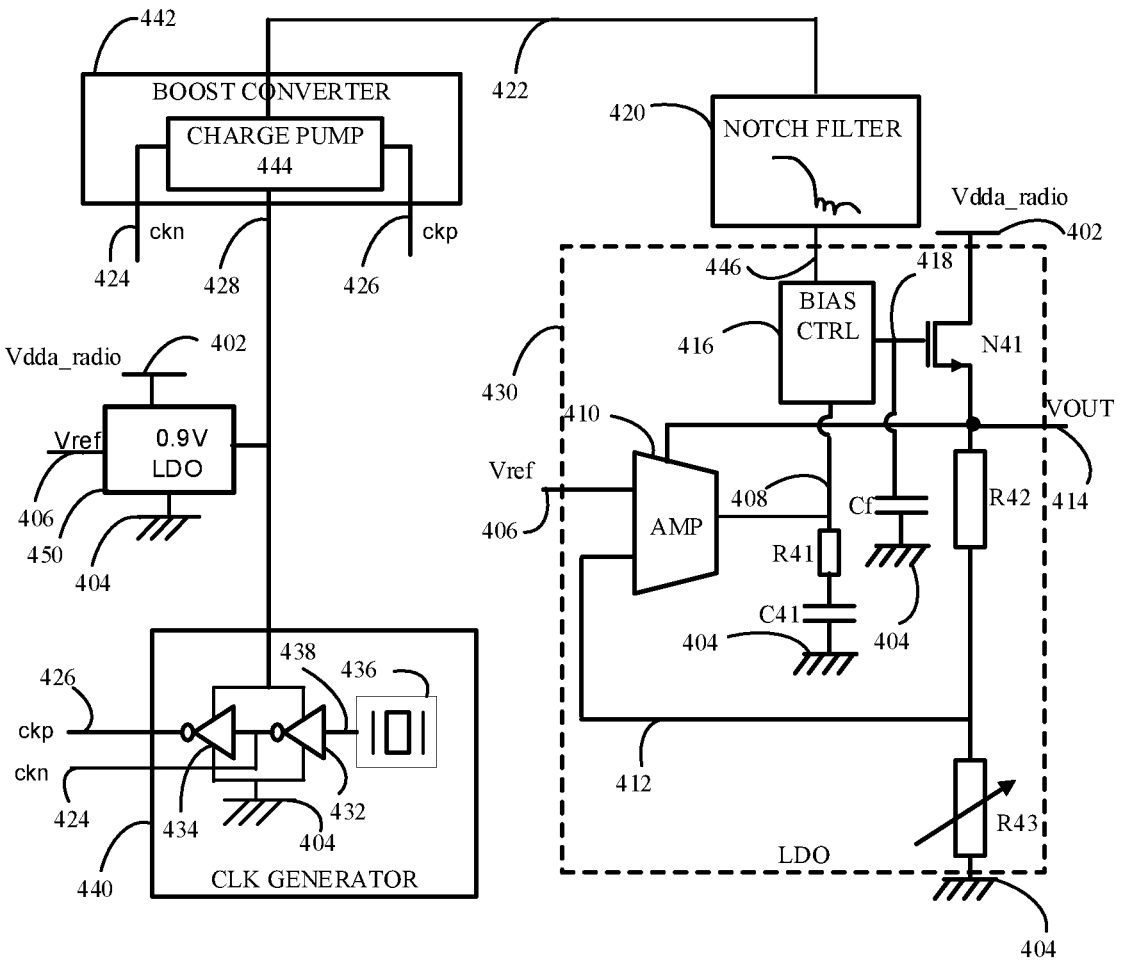
FIG. 8 shows a LDO regulator according to an embodiment.

FIG. 8 shows a power management system 400 according to an embodiment. The power management system includes a boost converter 442, a notch filter 420, a LDO 430, a clock generator 440 and a local LDO 450. The local LDO 450 includes an input connected to a reference voltage 406, and is connected to supply voltage rail 402 and ground 404. Local LDO 450 may be implemented using known circuit techniques and may supply a LDO voltage having a lower voltage than the supply voltage Vdda_radio supplied by voltage rail 402.

As illustrated, the boost converter 442 includes one charge pump 444 which may be implemented for example using charge pump circuit 208. In other examples, the boost converter may include more charge pumps. The charge pump 444 may have an input connected to local LDO output 428. The output of the charge pump 444 may be connected to the boost converter output 422. A first clock input of the boost converter 442 may be connected to an inverse clock signal output 424 from the clock generator 440. A second clock input of the boost converter 442 may be connected to a clock signal output 426 from the clock generator 440.

The boost converter output 422 may be connected to an input of the notch filter 420. An output of the notch filter 420 may be connected to the high-voltage supply node 446.

The LDO 430 may have a first terminal connected to the high-voltage supply node 446, a second terminal connected to a voltage reference 406, a third terminal connected to ground 404 and a fourth terminal connected to voltage supply 402 which in operation has a lower voltage than the high-voltage supply node 446. LDO 430 includes NMOS transistor N41 which has a drain connected to a supply rail 402 and a source connected to LDO output 414. A series arrangement of a resistor R42 and resistance R43 which may be fixed or variable resistors is connected between the LDO output 414 and a ground 404. Circuit node 412 is connected to the common connection between the resistances R42 and R42 and an input of the amplifier 410. A second input of the amplifier 410 may be connected to a reference voltage 406. The supply input of amplifier 410 may be connected to the LDO output 414. The ground connection to amplifier 410 is not shown. A resistor R41 and capacitor C41 are connected in series between the amplifier output 408 and ground 404. The amplifier output 408 is connected to an input of the bias control circuit 416. Bias control circuit output 418 is connected to the gate of the NMOS transistor N41. A feedback capacitor Cf is connected between the bias control circuit output 418 and ground 404. The bias control circuit 416 may be implemented by for example bias control circuit 160, bias control circuit 350 or other suitable circuits. In other examples, The LDO 430 may be implemented for example as LDO regulator 150.

The clock generator 440 may generate a clock signal clkp and inverse clock signal clkn. In other examples a single clock may be output from the clock generator and an inverter may be located in the boost converter. The clock generator 440 may have two clock inverters 432, 434 which are connected in series and connected to a supply node and ground 404. The local LDO output 428 may be connected to the supply of the clock inverters 432, 434. The input 438 of the first clock inverter 432 may be connected to the output of a crystal oscillator 436. The output of the first clock inverter 432 may be connected to the inverse clock signal output 424. The output of the second clock inverter 434 may be connected to the clock signal output 426.

The operation of the power management system 400 is similar to power management system 200. The main differences are the use of local LDO 450 which is supplied to both the clock generator 440 and boost converter 442. The local LDO 450 may supply a regulated voltage for example 0.9 volts which is already stable and so the feedback path from the notch filter to vary clock generator of power management system 200 is no longer required. As illustrated a single charge pump stage is used which may for example provide a boosted output voltage of 1.8 volts. After notch filtering, the value of Vsup_high at the output of the notch filter may be approximately 1.6 volts. The LDO 430 may be auto regulated from the output Vout since amplifier 410 is powered from the LDO output 414 Vout rather than Vdda as in other examples. This may improve PSRR and reduce current consumption since fewer elements of the power management system 400 are directly connected to Vdda.

The power management system 400 may have one single device N41 on the path from Vdda which for example in radio applications may be noisy, and against which the PSRR is expected to be very large and Vout. The switching noise from the boost converter is filtered out by the supply filter. Capacitor Cf may improve the regulator stability and improve out-of-loop PSSR. Because only a single device contributes to out-of-loop PSSR, this can be very predictable, and given by the ratio Cgd/Cf, Cgd being the gate to drain capacitor of the N-type pass device N41.

Figure 9:
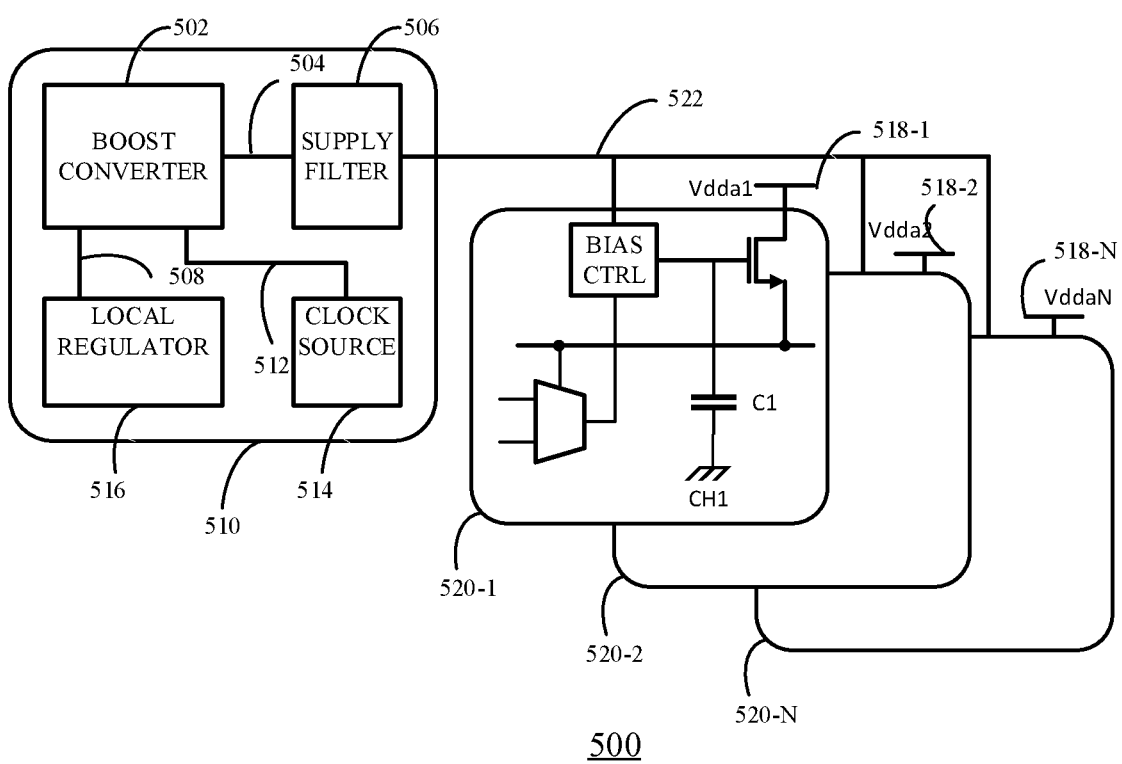
FIG. 9 illustrates a power management system including multiple LDO regulators and a gate driver for the LDO regulators according to an embodiment.

FIG. 9 shows a power management system 500 including multiple LDO regulators and a gate driver for the LDO regulators according to an embodiment. Gate driver 510 includes boost converter 502 having a clock input 512 connected to a clock source 514, a boost converter input 508 connected to a local regulator 516. The boost converter output 504 is connected to supply filter 506 which is implemented as a notch filter. The supply filter output may be connected to the gate driver output 522. The gate driver output may be connected to multiple LDOs 520-1, 520, 520-N. Each LDO may be a different voltage domain Vdda1, Vdda2, VddaN and have a different voltage supply 518-1, 518-2, 518-N. The voltages Vdda1, Vdda2, VddaN are less than the voltage Vsup_high supplied by gate driver 510. Each LDO 520-1, 520-2, 520-3 may be implemented similarly to LDO 430 for example.

power management system 500 may be scalable dependent on system requirements. If there are several regulators of the same type (i.e. which need a large gate drive voltage), the charge pump does not need to be duplicated per each regulator. This may allow high voltage generation to be confined and isolated in a specific place in the integrated circuit.

The maximum number of regulators N determines the design of the filter. To preserve the same DC voltage drop, the total resistance in series has to be Rseries/N, but capacitors do not double, as shown in notch filter 300. The high-pass path is to some extent independent from the low-pass path.

Table 1 below shows a possible optimization of the required capacitors for 1, 2, 3 and 4 regulators making use of a unique Vsup_high generator. The numbers indicate a normalized estimation of the capacitors, and are given for indication only.

TABLE 1

| | Baseline | Additional caps per LDO | | |
| --- | --- | --- | --- | --- |
| | 1 LDO | 2nd LDO | $3^{rd}$ LDO | $4^{th}$ LDO |
| Voltage doubler | 4 | 1 | 1 | 1 |
| Voltage doubler supply | 1 | 0 | 0 | 0 |

TABLE 1-continued

| | Baseline | Additional caps per LDO | | |
| | | 1 LDO | 2nd LDO | 3rd LDO | 4th LDO |
| --- | --- | --- | --- | --- | --- |
| Filter | 2.5 | 2.5 | 2.5 | 2.5 |
| LDO | 1 | 1 | 1 | 1 |
| Total | 8.5 | 13 | 17.5 | 22 |
| Total/Nb of LDOs | 8.5 | 6.5 | 5.8 | 5.5 |

There is a decreasing impact of the required capacitors area as the number of regulators increases. In this power management system 500, the supply filter filtering performance and DC drop is the same as for a single regulator. Isolating the filter confines the current spurs within the Vsup_high generator. The output voltage Vsup_high may then be cold i.e. free from any voltage spurs. This "cold" voltage may then be routed for example using a star routing topology to the regulators array, which may be located far from the high voltage generator which may be >100 microns from the regulator.

Figure 10:
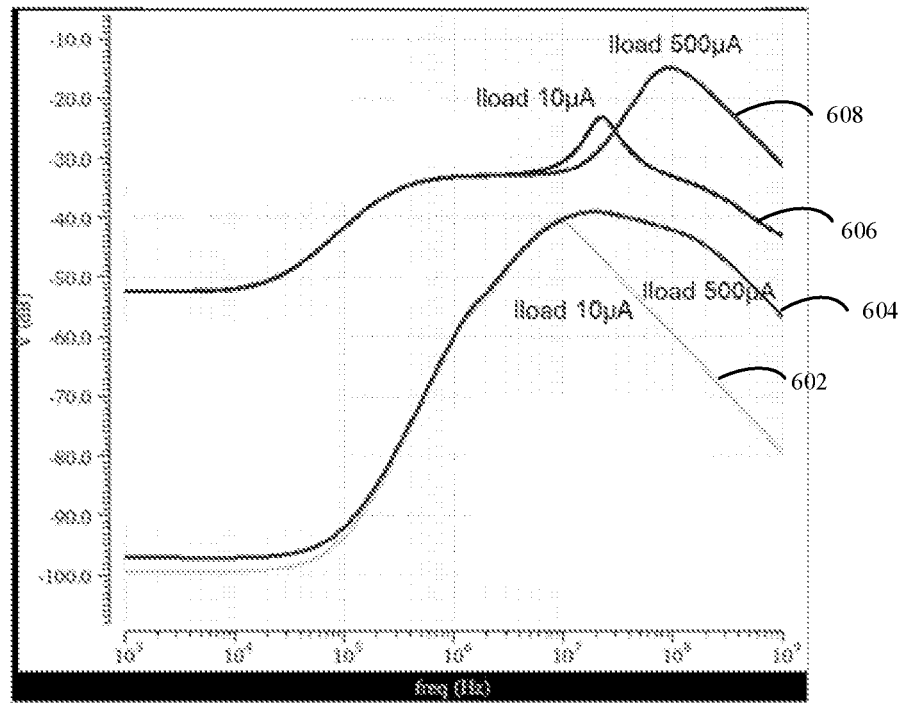
FIG. 10 illustrating the variation of PSSR versus frequency for an LDO according to an embodiment compared with a known PMOS-based LDO.

FIG. 10 shows a graph 600 illustrating the variation of PSSR from −100 to −10 dbV on a linear scale on the y-axis versus frequency on a logarithmic scale from 1 KHz to 1 GHz. Lines 606, 608 shows the variation for a prior art PMOS based LDO for a current load Iload of 10 uA and 500 uA respectively. Lines 602, 604 shows the variation for power management system 400 for a current load Iload of 10 uA and 500 uA respectively.

Embodiments include a gate driver and power management system which may provide a scalable biasing scheme for cap-less regulators with a voltage follower pass device. The gate driver may improve PSRR from DC to GHz, and hence may be included for example in RF transceivers or other sensitive environments. A plurality of regulators may be used with a single bias generator also referred to as a gate driver which may reduce the area required on an integrated circuit for implementation.

Embodiments of the power management system may be included in RF transceivers such as BLE/15.4/WiFi radios for IoT applications. Embodiments may also be included in ICs having supply domains with abrupt load changes including but not limited to a digital PLL, a digital modulator, large digital parts. Embodiments of the power management system may provide large PSRR are required over a wide frequency range.

A gate driver for a low drop-out (LDO) regulator, the LDO regulator including an NMOS transistor having one of a source and drain terminal configured to be coupled to a voltage supply and the other of the source and drain terminal coupled to the low drop out voltage regulator output. The gate driver includes a boost converter having a boost converter input configured to be coupled to a boost converter reference voltage, a boost converter output configured to output a boosted voltage greater than the boost converter reference voltage and the voltage supply; and a boost converter clock input configured to receive a clock signal. The gate driver further includes a notch filter having a notch filter input coupled to the boost converter output and a notch filter output coupled to the gate driver output.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A gate driver for a low drop-out (LDO) regulator, the LDO regulator including an NMOS transistor having one of a source and drain terminal configured to be coupled to a voltage supply and the other of the source and drain terminal coupled to the LDO regulator output, the gate driver comprising:
   a boost converter comprising:
      a boost converter input configured to be coupled to a boost converter reference voltage;
      a boost converter output configured to output a boosted voltage greater than the boost converter reference voltage and the voltage supply;
      a boost converter clock input configured to receive a clock signal;
   the gate driver further comprising:
      a notch filter having a notch filter input coupled to the boost converter output and a notch filter output coupled to an output of the gate driver; and
      a clock generator having a clock generator output coupled to the boost converter clock input and configured to output the clock signal on the clock generator output,
      wherein the notch filter comprises a further output, and the gate driver further comprises a feedback amplifier having a first feedback amplifier input coupled to the further notch filter output, a second feedback amplifier input configured to be coupled to a feedback reference voltage, and a feedback amplifier output coupled to a voltage supply rail of the clock generator, wherein the clock generator is configured to modulate the clock amplitude dependent on the difference between the further notch filter output voltage and the feedback reference voltage.

2. The gate driver of claim 1, wherein the notch filter comprises notches at frequencies of integer multiples of the clock signal frequency.

3. The gate driver of claim 2 wherein the notches comprise frequencies of the clock signal frequency, twice the clock signal frequency and four times the clock signal frequency.

4. The gate driver of claim 1 wherein the notch filter comprises a T-notch circuit.

5. The gate driver of claim 1 wherein the boost converter further comprises a charge pump.

6. The gate driver of claim 1 wherein the boost converter comprises a series arrangement of three charge pumps.

7. A power management system comprising the gate driver of claim 1 and further comprising the LDO regulator, the LDO regulator further comprising:

a bias control circuit having a bias control circuit input coupled to the notch filter output; and a bias control circuit output coupled to a gate of the NMOS transistor.

8. The power management system of 7 further comprising at least a second LDO regulator coupled to the gate driver, wherein the second LDO regulator is configured to be coupled to a voltage supply in a different voltage domain than the LDO regulator.

9. A gate driver for a low drop-out (LDO) regulator, the LDO regulator including an NMOS transistor having one of a source and drain terminal configured to be coupled to a voltage supply and the other of the source and drain terminal coupled to the LDO regulator output, the gate driver comprising:

a boost converter comprising:

a boost converter input configured to be coupled to a boost converter reference voltage;

a boost converter output configured to output a boosted voltage greater than the boost converter reference voltage and the voltage supply;

a boost converter clock input configured to receive a clock signal;

the gate driver further comprising:

a notch filter having a notch filter input coupled to the boost converter output and a notch filter output coupled to an output of the gate driver;

a clock generator having a clock generator output coupled to the boost converter clock input and configured to output the clock signal on the clock generator output; and a local LDO regulator having a local LDO regulator output, wherein the local LDO regulator output is coupled to a voltage supply rail of the clock generator and a boost converter input.

10. The gate driver of claim 9, wherein the notch filter comprises notches at frequencies of integer multiples of the clock signal frequency.

11. The gate driver of claim 9 wherein the notch filter comprises a T-notch circuit.

12. The gate driver of claim 9 wherein the boost converter further comprises a charge pump.

13. A power management system comprising the gate driver of claim 9 and further comprising the LDO regulator, the LDO regulator further comprising:

a bias control circuit having a bias control circuit input coupled to the notch filter output; and a bias control circuit output coupled to a gate of the NMOS transistor.

14. A power management system comprising:

a low drop-out (LDO) regulator;

a gate driver for the low drop-out (LDO) regulator, the LDO regulator including an NMOS transistor having one of a source and drain terminal configured to be coupled to a voltage supply and the other of the source and drain terminal coupled to the LDO regulator output, the gate driver comprising:

a boost converter comprising:

a boost converter input configured to be coupled to a boost converter reference voltage;

a boost converter output configured to output a boosted voltage greater than the boost converter reference voltage and the voltage supply; and a boost converter clock input configured to receive a clock signal;

the gate driver further comprising:

a notch filter having a notch filter input coupled to the boost converter output and a notch filter output coupled to an output of the gate driver; and a feedback capacitor coupled between the bias control circuit output and the ground.

15. A power management system comprising:

a low drop-out (LDO) regulator;

a gate driver for the low drop-out (LDO) regulator, the LDO regulator including an NMOS transistor having one of a source and drain terminal configured to be coupled to a voltage supply and the other of the source and drain terminal coupled to the LDO regulator output, the gate driver comprising:

a boost converter comprising:

a boost converter input configured to be coupled to a boost converter reference voltage;

a boost converter output configured to output a boosted voltage greater than the boost converter reference voltage and the voltage supply; and a boost converter clock input configured to receive a clock signal;

the gate driver further comprising:

a notch filter having a notch filter input coupled to the boost converter output and a notch filter output coupled to an output of the gate driver;

the LDO regulator further comprising:

a LDO feedback amplifier and a series arrangement of a first resistor and a first capacitor coupled between an LDO feedback amplifier output and a ground and coupled to a second bias control circuit input.

16. The power management system of claim 15, wherein the LDO regulator further comprises a second and third resistor arranged in series between the LDO output and the ground, and the LDO feedback amplifier further comprises a LDO feedback amplifier supply node coupled to the LDO output, a first LDO feedback amplifier input coupled to a common node between the second and third resistor, a second LDO feedback amplifier input coupled to a bias reference voltage.

17. The power management system of claim 15, wherein the LDO regulator further comprises a second and third resistor arranged in series between the LDO regulator output and the ground, and the LDO feedback amplifier further comprises a LDO feedback amplifier supply node configured to be coupled to the voltage supply, a first LDO feedback amplifier input coupled to a common node between the second and third resistor, a second LDO feedback amplifier input coupled to a bias reference voltage.

18. A method of power management comprising:

providing a low dropout (LDO) regulator;

driving a gate of an output stage NMOS transistor included in the low dropout (LDO) regulator having one of a source and drain terminal configured to be coupled to a voltage supply and the other of the source and drain terminal coupled to an LDO regulator output, by:

boosting a boost converter reference voltage;

notch filtering the boosted reference voltage; and providing the filtered boosted reference voltage to the LDO regulator to drive the gate of the NMOS transistor; wherein the filtered boosted reference voltage is greater than the voltage of the voltage supply, wherein the LDO regulator further comprises a bias control circuit having a bias control circuit input coupled to the notch filter output; and a bias control circuit output coupled to a gate of the output stage NMOS transistor, and wherein providing the LDO regulator is performed such that the LDO regulator further comprises a first and second resistor arranged in series between the LDO output and the ground, and a LDO feedback amplifier further comprising a LDO feedback amplifier supply node coupled to the LDO output, a first LDO feedback amplifier input coupled to a common node between the first and second resistor, and a second LDO feedback amplifier input coupled to a bias reference voltage.

19. The method of claim 18 further comprising: notch filtering the boosted reference voltage with a notch filter comprising notches at frequencies of integer multiples of the clock signal frequency.

20. The method of claim 18, wherein the notches of the notch filter comprise frequencies of the clock signal frequency, twice the clock signal frequency and four times the clock signal frequency.

* * * * *